United States Patent [19]
Koike

[11] Patent Number: 5,393,976
[45] Date of Patent: Feb. 28, 1995

[54] APPARATUS FOR DISPLAYING A SAMPLE IMAGE

[75] Inventor: Hirotami Koike, Tokyo, Japan

[73] Assignee: Kabushiki Kaisha TOPCON, Tokyo, Japan

[21] Appl. No.: 156,626

[22] Filed: Nov. 24, 1993

[30] Foreign Application Priority Data

Nov. 26, 1992 [JP] Japan .................................. 4-317445

[51] Int. Cl.6 .......................................... H01J 37/256
[52] U.S. Cl. ..................... 250/310; 250/306; 250/311
[58] Field of Search ................ 250/310, 311, 306, 307

[56] References Cited
U.S. PATENT DOCUMENTS 3,614,311 10/1971 Fujiyasu et al. ..................... 250/310
4,041,311 8/1977 Martin .................................. 250/310
4,146,788 3/1979 Mirkin et al. ........................ 250/310
4,560,872 12/1985 Antonovsky ........................ 250/310

Primary Examiner—Jack I. Berman
Attorney, Agent, or Firm—Finnegan, Henderson, Farabow, Garrett & Dunner

[57] ABSTRACT

An apparatus for displaying a sample image comprises a scanning illumination system 3 for scanning a sample by an irradiation ray ray being relatively moved, a first detection portion 7 for detecting a first detection signal obtained from a continuous area of the sample by the irradiation ray ray, a second detection portion 9 for detecting a faint second detection signal obtained from a micro-discrete area of the sample by the irradiation ray ray, a signal processing portion 16 for processing the second detection signal such that a pixel size in accordance with the second detection signal is enlarged relative to a pixel size in accordance with the first detection signal, an image signal formation portion 17 for forming a superimposed image signal by superimposing the second detection signal processed by the signal processing portion upon the first detection signal, and an image display portion 19 for displaying an image of the sample in accordance with the superimposed image signal.

6 Claims, 8 Drawing Sheets

APPARATUS FOR DISPLAYING A SAMPLE IMAGE

BACKGROUND OF THE INVENTION

1. Field of the Invention

This invention relates to an improvement of an apparatus for displaying a sample image, in which a continuous area corresponding to a morphological part of a sample, which is enlarged using a scanning electron microscope, a transmission electron microscope, a tunnel scanning microscope, or the like, and a micro-discrete area corresponding to a particular part of the sample are displayed in a superimposed condition relative to each other.

2. Prior Art

Heretofore, there has been known a sample image displaying apparatus for displaying an image of a sample in an enlarged scale using a scanning electron microscope (SEM), a transmission electron microscope (TEM), a tunnel scanning microscope (STM). For example, the scanning electron microscope scans an electron ray as charged particles on a sample surface (the terms "irradiation ray" used herein includes charged particles).

The sample image displaying apparatus includes an electron detection portion as a first detection portion, and a light receiving portion as a second detection portion. The electron detection portion is operated to detect a secondary electron or reflection electron produced by scanning of the electron ray. In accordance with the detection signal coming from the electron detection portion, dark and faint, white and black image signals are formed. Then, an image of the continuous area corresponding to the morphological structure of the sample is formed by the dark and faint, white and black image signals. At this time, a particular part of the sample is, in some cases, stimulated (cathodeluminescence) by irradiation of the electron ray. The light receiving portion receives that cathodeluminescence. For example, in the case where the sample is a mitochondrion of a biological cell, a continuous area image 1 is displayed as a morphological sample image such as the contour of the cell, the boundary of the cell, or the like by detection of the secondary electron or reflection electron (see FIG. 10). At the same time, by receiving the cathodeluminescence of a cholesterol caused by irradiation of the electron ray, there can be obtained a color image signal corresponding to a luminous part 2a of the sample (see FIG. 11). By this color image signal, a color image 2 as a micro-discrete area is displayed.

Heretofore, the continuous area image 1 obtained by bombarding of an electron ray, and the color image 2 obtained by a photoluminescence are separately taken in photographs, and the continuous area image 1 and the color image 2 are placed side by side for comparison in order to identify the illumination part of the sample.

Therefore, it is difficult to obtain a corresponding relation between each part of the continuous area image 1 of the sample and the luminous part 2a of the sample in such cases that the continuous area image 1 is complicated in shape and the cathodeluminescence is faint. Particularly, if the power is increased, a bombarding quantity of the electron ray is increased. Therefore, when the sample is a biological material, the chemical bond of polymer is disconnected by bombardment with the electron ray and as a result, discoloration occurs. Moreover, the cathodeluminescence becomes extremely faint, and the luminous area is difficult to be identified when the sample of a biological material is observed with high power. In other words, it is difficult to recognize the distribution of minor components which are contained in the sample.

In view of the above, the present applicant previously filed a Japanese Patent Application No. Hei 4-130966 under the title of "apparatus for morphological observation of a sample", in which the continuous area image 1 and the luminous part 2a of the color image 2 are displayed in a superimposed condition relative to each other.

However, in the case where the continuous area image 1 and the luminous part 2a of the color image 2 are displayed in a superimposed condition relative to each other, if the luminous part 2a is on the order where the luminous part 2a can be displayed by one pixel, the extremely faint luminous part 2a that can be displayed by one pixel or so, is buried in the continuous area image 1. Therefore, it is practically impossible to recognize the luminous part of the continuous area image 1. The reason is that the continuous area image 1 which is to be displayed in a colorless condition, originally has the color components of R, G and B.

SUMMARY OF THE INVENTION

It is, therefore, the object of the present invention to provide an apparatus for displaying a sample image, in which when an image of a micro-discrete area is displayed in a superimposed relation to an image of a continuous area, the image of the micro discrete area can be displayed so clearly as to be identified, without being buried in the image of the continuous area.

According to the present invention, there is provided, in order to achieve the above object, an apparatus for displaying a sample image comprising:

a scanning illumination system for scanning a sample by an irradiation ray being relatively moved;

a first detection portion for detecting a first detection signal obtained from a continuous area of said sample by the irradiation ray;

a second detection portion for detecting a faint second detection signal obtained from a micro-discrete area of said sample by the irradiation ray;

a signal processing portion for processing the second detection signal such that a pixel size in accordance with said second detection signal is enlarged relative to a pixel size in accordance with said first detection signal;

an image signal formation portion for forming a superimposed image signal by superimposing the second detection signal processed by said signal processing portion upon said first detection signal; and an image display portion for displaying an image of said sample in accordance with said superimposed image signal.

According to the apparatus for displaying a sample image of the present invention, the scanning illumination system scans the sample by relatively moving the irradiation ray. The first detection portion detects the first detection signal obtained from the continuous area of the sample by the irradiation ray. The second detection portion detects the faint second detection signal obtained from the micro-discrete area of the sample by the irradiation ray. The signal processing portion processes the second detection signal such that the pixel size in accordance with the second detection signal is enlarged relative to the pixel size in accordance with the first detection signal. The image signal formation portion forms a superimposing image signal by superimposing the second detection signal processed by the signal processing portion and the first detection signal one upon the other. The image display portion displays the continuous area and the micro-discrete area in a superimposed condition relative to each other in accordance with the superimposing image signal.

DESCRIPTION OF THE PREFERRED EMBODIMENTS

Several embodiments according to the present invention will be described the accompanying drawings.

Figure 1:
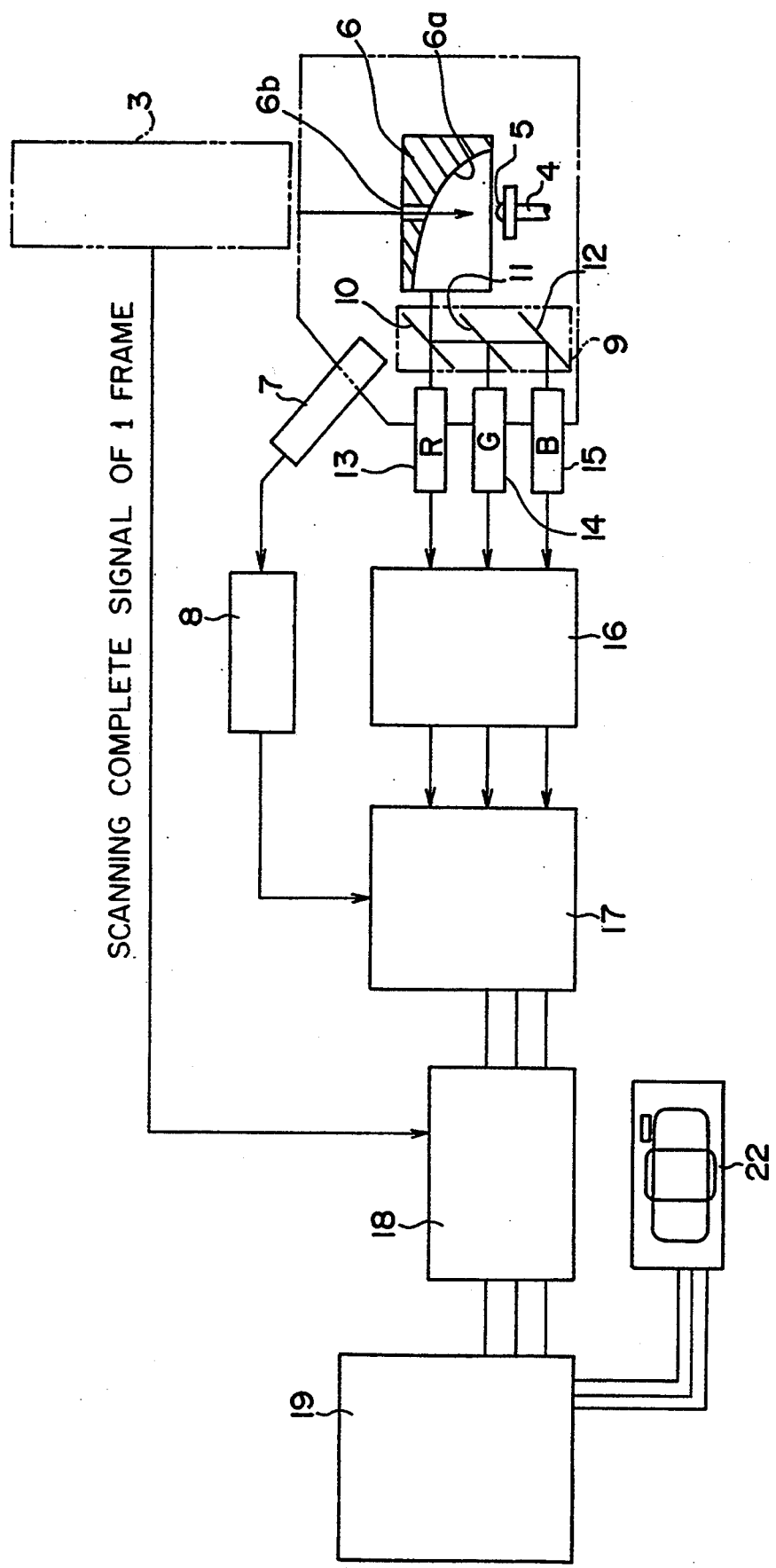
FIG. 1 shows a first embodiment of an apparatus for displaying a sample image according to the present invention applied to a scanning electron microscope.
Figure 10:
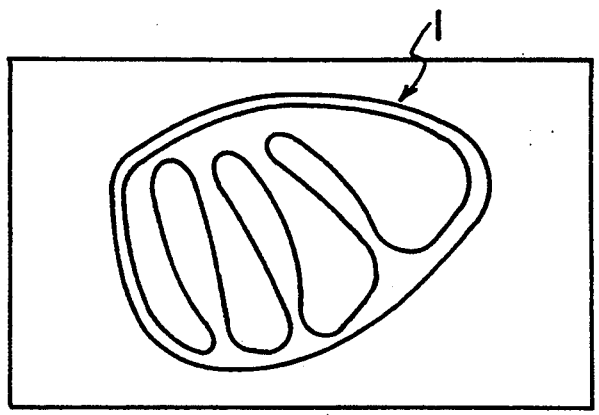
FIG. 10 shows a displaying condition of a morphological image according to the prior art.
Figure 11:
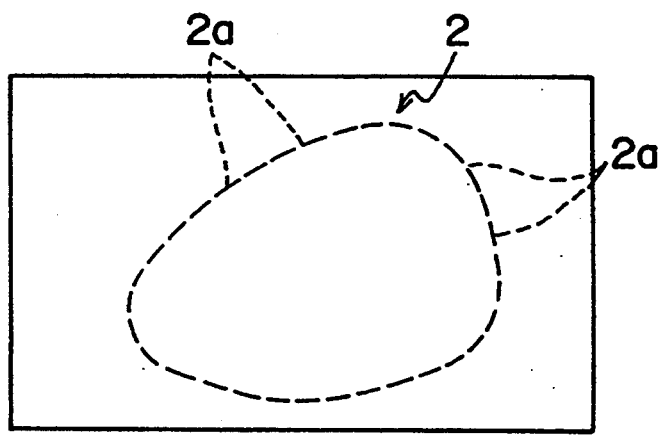
FIG. 11 shows a displaying condition of a luminous part of a sample according to the prior art.

In FIG. 1, reference numeral 3 denotes an illumination system of a scanning electron microscope. This illumination system 3 includes an electron gun, a focusing lens, a scanning coil, and an objective lens (all not shown) as known per se. A sample stage 4 is disposed at a lower part of the illumination system 3. The sample stage 4 is adjustable in position relative to the illumination system 3. A cutting-piece of a sample 5 such as a semiconductor, a compound, or a biological cell is to be placed on the sample stage 4. Here, a mitochondrion of a biological cell is placed on the sample stage 4 as the sample 5. One ellipsoidal mirror 6 is provided between the sample stage 4 and the illumination system 3. Reference numeral 6a denotes a reflection surface of the ellipsoidal mirror 6. This ellipsoidal mirror 6 has a through-hole 6b as an electron ray transmission portion. The electron ray as charged particles is contracted narrow so as to be able to pass through the through-hole 6b. Each part of the cutting-piece of the sample 5 is scanned by the electron ray. Irradiated by the electron ray, the sample 5 discharges secondary electrons. Some of the scanning electron microscopes are of the type capable of detecting electrons which are backscattered by each part (each scanning point) of the sample 5 upon bombarding of the electron ray. In the case of a transmission electron microscope, it suffices that the electrons transmitted are detected. In the case of a tunnel scanning microscope (STM), the secondary electrons are detected by a photomultiplier tube 7 as an electron detector and amplified. The secondary electrons are changed in generating amount in such a manner as to correspond to each part of the sample. The secondary electrons are once converted to light and amplified by the photomultiplier tube 7 so as to be converted to electrons again. The detection signal of the photomultiplier tube 7 is inputted into a signal converter 8 through a preamplifier (not shown). The signal converter 8 forms a white and black morphological image signal (corresponding to a brightness signal of a television) corresponding to the continuous area image 1 of the sample 5, in accordance with a first detection signal.

Upon bombardment of the electron ray, a cathode-luminescence (CL) as a faint second detection signal is emitted from a micro-discrete area where a cholesterol of a minor component is present. The ellipsoidal mirror 6 has a role for collecting the cathode-luminescence. The cutting-piece of the sample 5 is in a location where one focal position of the ellipsoidal mirror 6 resides. The cathode-luminescence is reflected by the reflection surface 6a of the ellipsoidal mirror 6 and received by a light receiving portion 9 as a second detection portion. The light receiving portion 9 comprises dichroic mirrors 10 and 11 as a color-separation optical system for separating the cathode-luminescence in color, a total reflection mirror 12, and photomultiplier tubes 13, 14 and 15. The dichroic mirror 10 transmits a red-color light including (R-ray) including a near infrared ray and reflects the remaining ray. The dichroic mirror 11 reflects a green-color ray (G-ray) and transmits the remaining blue-color ray (B-ray) including an ultraviolet ray. The total reflection mirror 12 reflects the blue-color ray. The green-color ray B is guided to the photomultiplier tube 15. Each light receiving surface of the photomultiplier tubes 13, 14 and 15 is in place equivalent to the other focal position of the ellipsoidal mirror 6. The photomultiplier tubes 13, 14 and 15 increase and output color separation signals of R, G and B, respectively, in such a manner as to correspond to the ratio of colors included in the cathode-luminescence.

Figure 2:
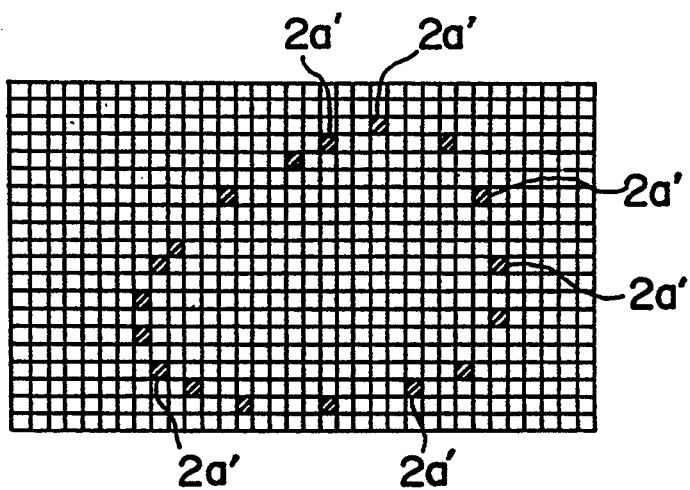
FIG. 2 shows a pixel size in accordance with a detection signal coming from a micro-discrete area of one pixel or so displayed on a screen without being enlarged.

The color separation signals are inputted into a pixel size enlargement circuit 16 as a signal processing portion. Now, presume that the cathode-luminescence is present from a micro-discrete area of one pixel or so. If an image is displayed using this signal as it is, the micro-discrete area is displayed in the unit of one pixel (see FIG. 2). In this case, if the image of the micro-discrete area is displayed in such a manner as to be superimposed on the image of the continuous area, the image of the micro-discrete area is buried in the image of the continuous area. In FIG. 2, reference numeral 2a' denotes a luminous part of the micro-discrete area.

The pixel size enlargement circuit 16 processes the color separation signal in such a manner as to enlarge the pixel size in accordance with the color separation signal as the second detection signal relative to the pixel size in accordance with the first detection signal.

Figure 3:
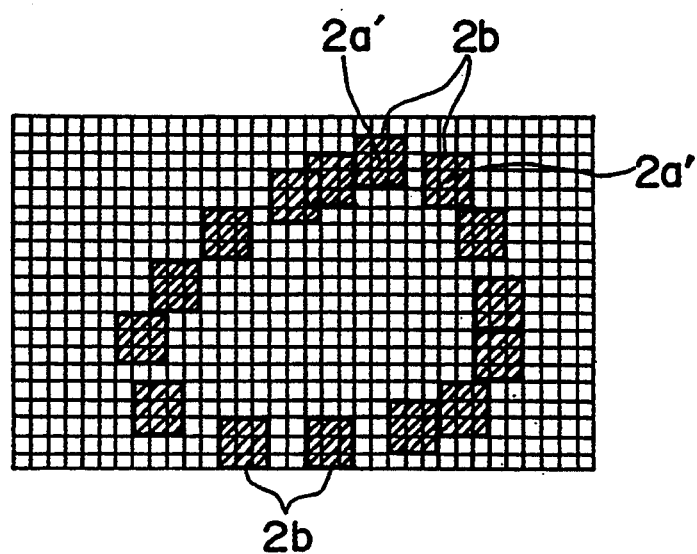
FIG. 3 is a schematic view showing one example of an enlarged pixel size before superimposing an image thereon.

FIG. 3 shows one example of the enlargement of the pixel size of the luminous part 2a'. In this FIG. 3, the pixel size of the luminous part 2a' is enlarged by multiplying 3 by 3 with reference to the pixel size of the morphological image. In FIG. 3, reference numeral 2b denotes such enlarged luminous part. The enlargement of the pixel size is performed for each of the color separation signals R, G and B.

The signals subjected to pixel size enlargement processing and obtained by enlarging the pixel size and the morphological image signal are inputted into an adder 17 as an image signal formation portion. The adder 17 adds up the color separation signals of R, G and B simultaneously obtained (obtained at a simultaneous scanning timing) in the respective parts under scanning (respective scanning points), and the morphological image signal from the signal converter 8. By this, superimposed image signals of R, G and B at the respective parts (respective scanning parts) are formed.

The respective superimposed image signals at the respective parts are inputted into a memory unit 18. The memory unit 18 stores the superimposed image signal of the red color, the superimposed image signal of the blue color and the superimposed image signal of the green color as an image information for one field (one frame). The superimposed image signal of the red color, the superimposed image signal of the blue color and the superimposed image signal of the green color all for one frame are inputted into a color monitor 19. The color monitor 19 has a role for functioning as a morphological image formation portion of the sample. On the image surface of the color monitor 19, the luminous part of the morphological image emphasized chromatically is displayed in such a manner as to be superimposed on the part corresponding to its shading morphological image. As a result, we can see clearly recognized the luminous parts of the morphological image.

Figure 4:
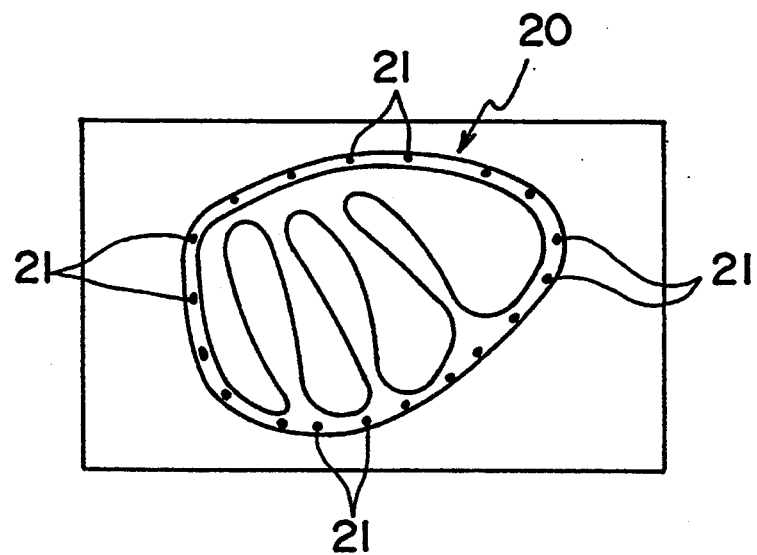
FIG. 4 shows a morphological image and an image of a micro-discrete area having an enlarged pixel size, superimposed one upon the other.

FIG. 4 shows a superimposed image displayed on the color monitor 19. In FIG. 4, reference numeral 20 denotes a mitochondrion 20 as the morphological image. Reference numeral 21 denotes a micro-discrete area. As shown in FIG. 4, even if the image of the micro-discrete area 21 is displayed in a superimposed condition relative to the image of the continuous area, the image of the micro-discrete area 21 can be displayed in such a manner as to be easily identified without being buried in the image of the continuous area. The superimposed image displayed on the color monitor 19 can be taken in color by a camera 22 in accordance with necessity. The enlargement of the pixel size is not limited to multiplying 3 by 3.

Figure 5:
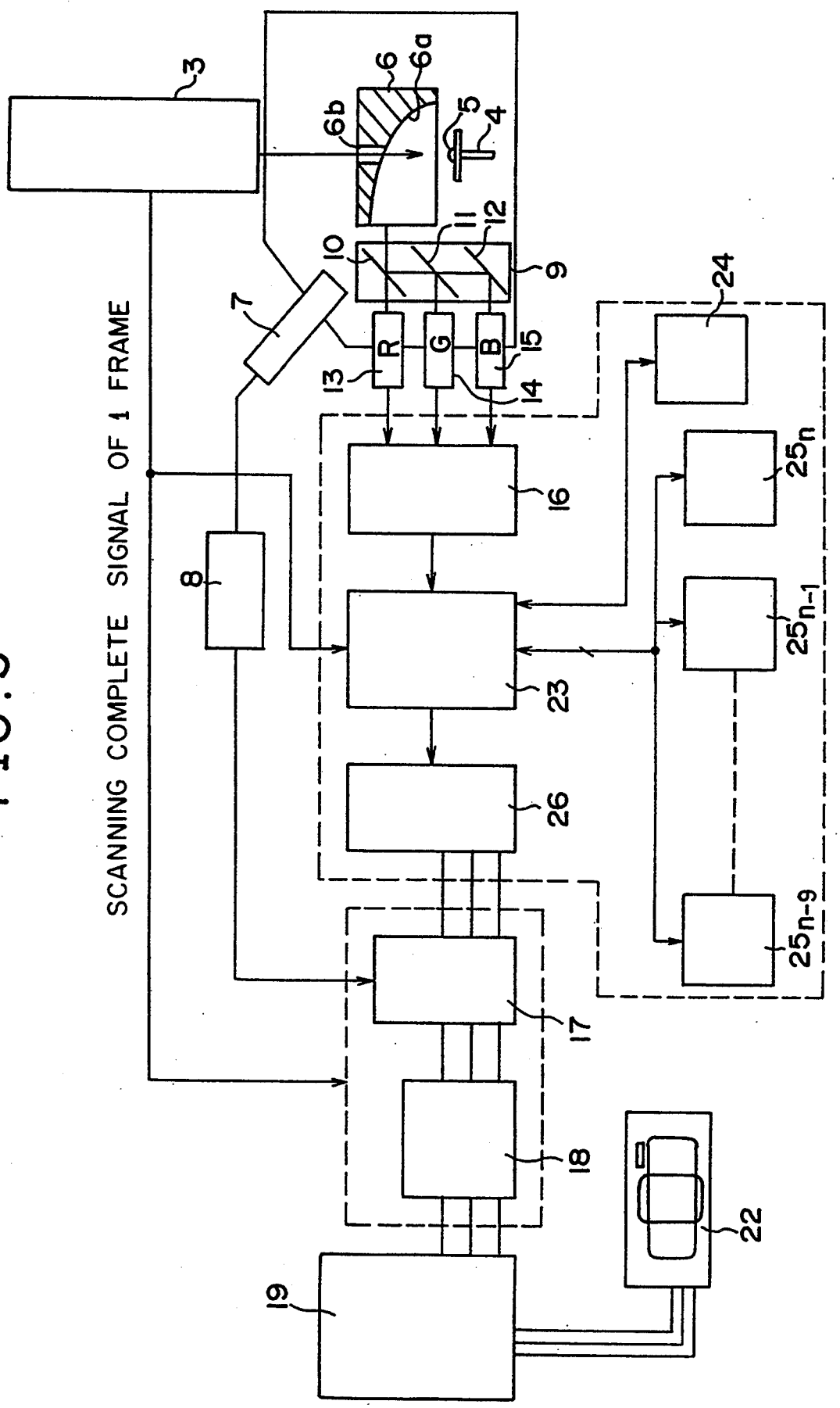
FIG. 5 shows a second embodiment of an apparatus for displaying a sample image according to the present invention applied to a scanning electron microscope.
Figure 6:
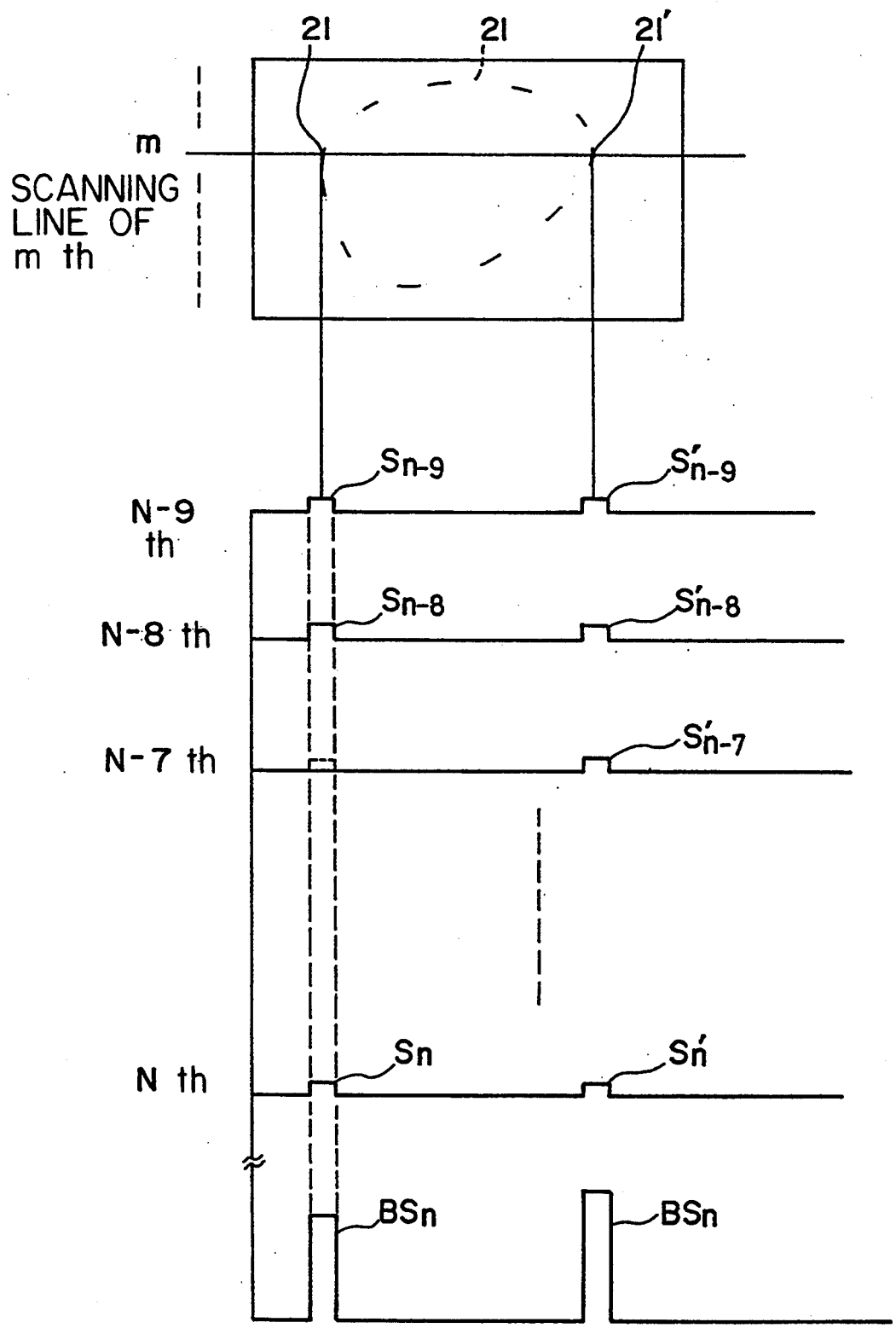
FIG. 6 is an explanatory view showing one example of the multiplication shown in FIG. 5.

FIGS. 5 and 6 show a second embodiment of an apparatus for displaying a sample image according to the present invention. In this second embodiment, the respective signals obtained by enlarging the pixel sizes are multiplied for predetermined time intervals, respectively. By this, the signals obtained by enlarging the pixel sizes are underlined.

Figure 7:
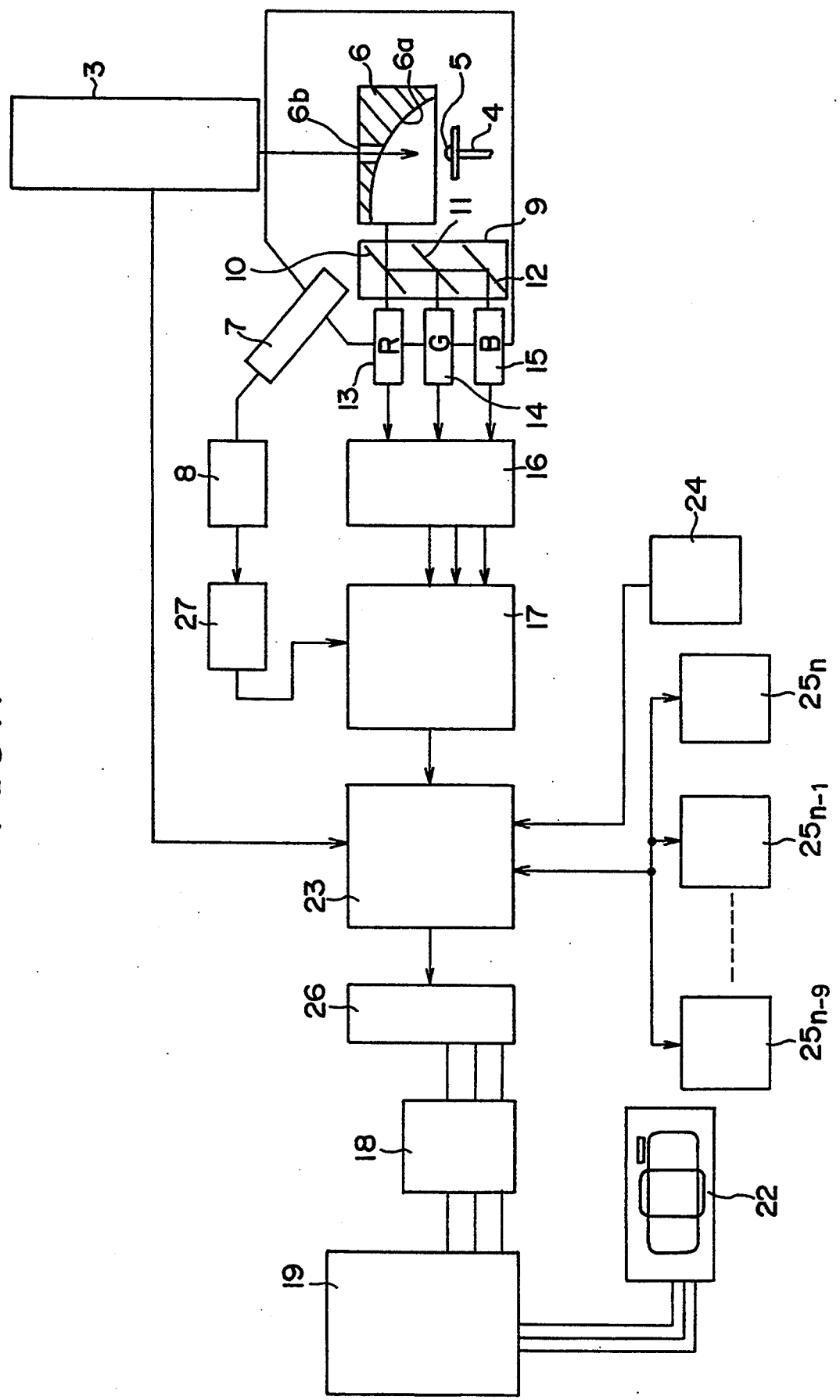
FIG. 7 shows a third embodiment of an apparatus for displaying a sample image according to the present invention applied to a scanning electron microscope.

In FIG. 7, reference numeral 23 denotes a distribution control circuit, reference numerals 24, $25n$, $25n\text{-}1$, ..., $25n\text{-}9$ denote integration buffer memory units, respectively, and reference numeral 26 denotes an integration circuit.

The signals obtained by enlarging the pixel sizes are inputted into the distribution control circuit 23, and stored in the integration buffer memory units 24, $25n$, $25n\text{-}1$, ..., $25n\text{-}9$ for one frame. In the integration buffer memory units 24, $25n$, $25n\text{-}1$, ..., $25n\text{-}9$, the signals obtained by enlarging the pixel sizes corresponding to the image information corresponding to the past 10 times portion in total are stored. These integration buffer memory units 24, $25n$, $25n\text{-}1$, ..., $25n\text{-}9$ are arranged in order of from a lower position to a higher position so that information can be stored in order of older information to newer information.

That is, the integration buffer memory unit $25n\text{-}9$ for the lowest position stores the signal obtained by enlarging the pixel size for one frame based on the scanning made ten times before that time, presuming that the scanning time is N at that time. The integration buffer memory unit $25n\text{-}8$, one position higher than the integration buffer memory unit $25n\text{-}9$, stores the signal obtained by enlarging the pixel size for one frame based on the scanning made nine times before that time. In this way, the integration buffer memory units stores the information in order of older information to newer information. The integration buffer memory unit $25n$ stores the signal obtained by enlarging the pixel size for one frame based on Nth time scanning.

Now, presume that the respective integration buffer memory units $25n$, $25n\text{-}1$, ..., $25n\text{-}9$ store the signals obtained by enlarging the pixel sizes, respectively. When the N+1th time scanning is completed, the signal obtained by enlarging the pixel size based on this N+1th time scanning is temporarily stored in the integration buffer memory unit 24. At the same time, the distribution control circuit 23 accesses to the signals obtained by enlarging the pixel sizes and stored in the respective integration buffer memory units $25n$, $25n\text{-}1$, ..., $25n\text{-}0$ and outputs the same toward the integration circuit 26.

The integration circuit 26 integrates the signals obtained by enlarging the pixel sizes for ten pieces. FIG. 6 is an explanatory view for explaining one example of the integration.

In FIG. 6, the signals obtained by enlarging the pixel sizes based on the N−9th time scanning in accordance with the micro-discrete areas 21, 21' corresponding to the number, m. scanning ray are denoted by reference numerals Sn-9 and Sn-9', respectively. The signals obtained by enlarging the pixel sizes based on N−8th time scanning, are denoted by reference numerals Sn-8 and Sn-8', respectively. The signals obtained by enlarging the pixel sizes based on the Nth time scanning are denoted by reference numerals Sn and Sn', respectively.

The integration circuit 26 integrates the signals obtained by enlarging the pixel sizes and makes such integrated signals BSn. The integration circuit 26 outputs the integrated signals BSn toward the adder 17. The adder 17 performs the same procedure as in the first embodiment. The luminous phenomenon of the micro-discrete areas 21 and 21' is subjected to probability. For example, as shown by the N−7th time scanning of FIG. 6, there is a possibility that a faint second detection signal (signal obtained by enlarging the pixel size) in accordance with the photoluminescence cannot be obtained from the micro-discrete area 21.

In such a case as just mentioned, under normal procedure, the faint second detections signal is erased by background noises which are produced at random and therefore, information on the micro-discrete area 21 cannot be obtained.

However, even in such a case as just mentioned, if the signals obtained by enlarging the pixel sizes are integrated and then averaged, the background noise component can be removed. Therefore, the faint second detection signal caused by the cathodeluminescence is underlined and extracted.

After accessing to the signals obtained by enlarging the pixel sizes stored in the respective multiplication buffer memory units 25n, 25n-1, ..., 25n-9, the distribution control circuit 23 performs the following procedure.

That is, the distribution control circuit 23 discards the signals obtained by enlarging the pixel sizes for one image screen stored in the integration buffer memory unit 25n-9 in the lowest position. Then, the distribution control circuit 23 transmits the signals obtained by enlarging the pixel sizes stored in the integration buffer memory unit 25n-8 which is higher by one position to the integration buffer memory unit 25n-9 which is lower by one position, and stores the same therein. The distribution control circuit 23 performs this procedure in order. The signals in the integration buffer memory unit 25n obtained by enlarging the pixel sizes are stored in the integration buffer memory unit 25n-1 which is lower by one position. The newest (CN+1th time scanning) signals obtained by enlarging the pixel sizes stored in the integration buffer memory unit 24 are stored in the integration buffer memory unit 25n. In this way, old information is discarded and new signals obtained by enlarging the pixel sizes are gradually stored for ten image screens.

Figure 8:
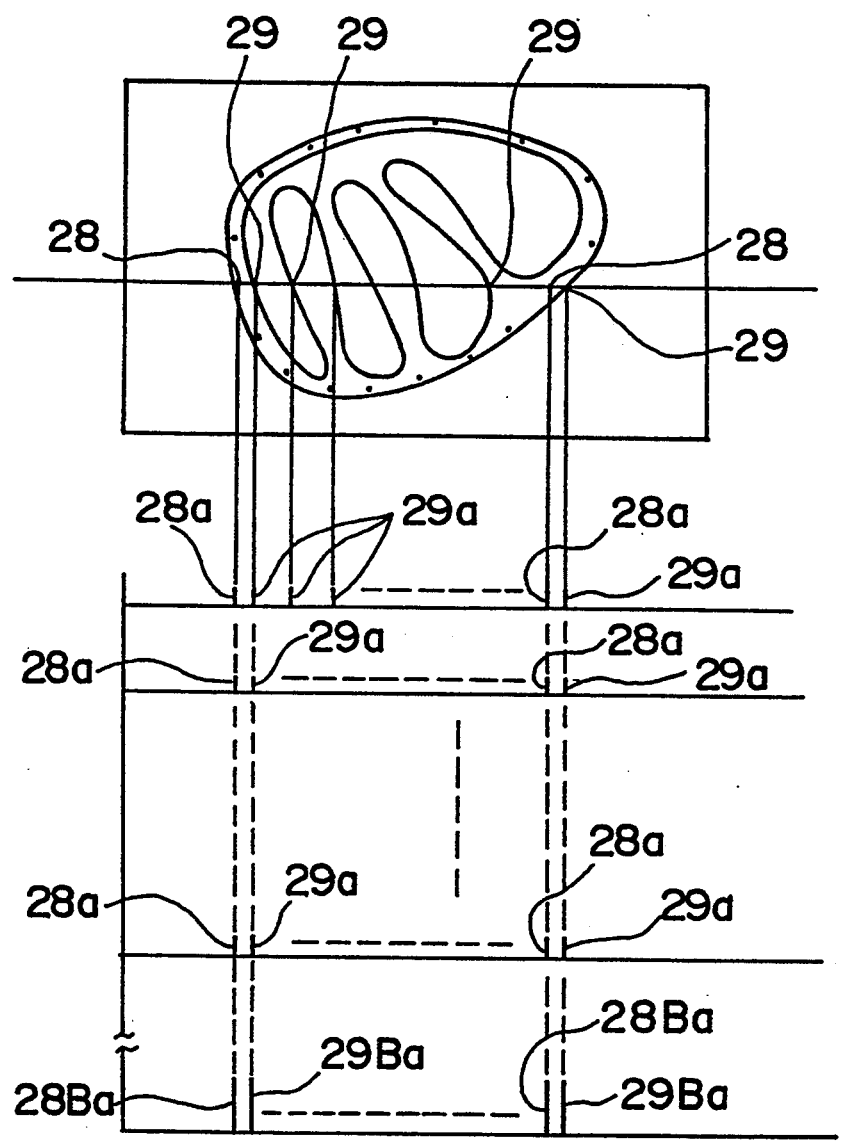
FIG. 8 is an explanatory view showing one example of the multiplication shown in FIG. 7.

FIGS. 7 and 8 show a third embodiment of an apparatus for displaying a sample image according to the present invention.

In this third embodiment, the morphological image signal and the respective color separation signals are added up first, and the morphological image signal and the color separation signals are superimposed relative to each other. Thereafter, the morphological image signal and the signals obtained by enlarging the pixel sizes are integrated.

A dumper 27 is provided between the adder 17 and the signal converter 8 so that the morphological image signal will not be saturated when integrated. The distribution control circuit 23 and the integration circuit 26 are provided between the memory unit 18 and the adder 17. Connection of the integration buffer memory units 24, 25n, 25n-1, ..., 25n-9 is the same as in the second embodiment.

In the case of this embodiment, each morphological image signals and the signals obtained by enlarging the pixel sizes are integrated (see FIG. 8). In FIG. 8, reference numeral 28 denotes a micro-discrete area, reference numeral 29 denotes a boundary portion of a continuous area, reference numeral 28a denotes signals obtained by enlarging the pixel sizes, reference numeral 29a denotes morphological image signals at the boundary portion of the continuous area, reference numeral 28Ba denotes denote signals obtained by enlarging the pixel sizes, and reference numeral 29B denotes integration morphological image signals. The remainder is the same as the second embodiment.

Figure 9:
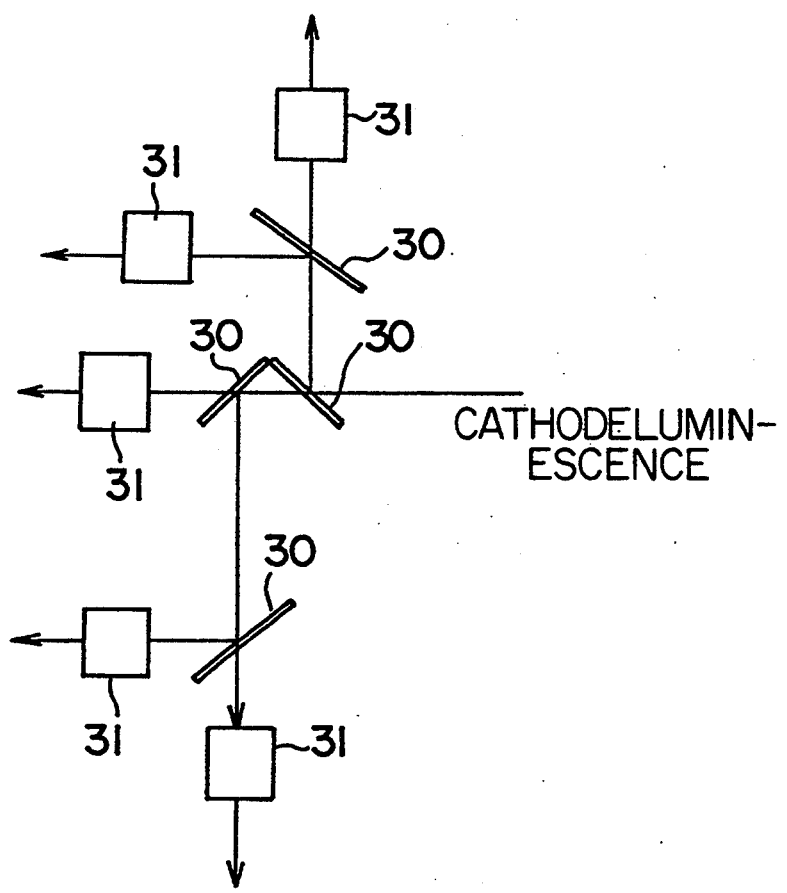
FIG. 9 shows a modified example of a light receiving portion shown in the first to third embodiments.

FIG. 9 shows a fourth embodiment of an apparatus for displaying a sample image according to the present invention.

This fourth embodiment is of the type in which the photoluminescence is detected in accordance with the wavelength.

According to this embodiment, there can be obtained other color separation signals than three primary colors of R, G and B within the range from ultraviolet to infrared.

In FIG. 9, reference numeral 30 denotes color separation dichroic mirrors, and reference numeral 31 denotes optical fibers. The respective color separation signals guided by the respective optical fibers 31 are inputted into a pixel size enlarging circuit through a photomultiplier tube.

According to this embodiment, the present invention can also be applied to X-ray analysis, elementary analysis by an electron energy loss spectroscopy (EELS), and surface elementary analysis by an Auger device, etc.

Furthermore, in the case that the morphological image based on the powerful signal is displayed on the screen in black and white whereas the other image based on the faint signal is displayed on the screen in color, if the powerful signal corresponding to the morphological image and the faint signal corresponding to the other image are integrated respectively in the same condition, the powerful signal becomes saturation due to the integration. Consequently, the morphological image becomes pure white, since the black-white signal includes R, G, and R signal component naturally.

Accordingly, for example, when the averaging and integration are carried out, the signal processing portion integrates secondary electron signal, which corresponds to morphological image signal, 4 times to 8 times in given time with the recurrsible filter method. On the other hand, the signal processing portion integrates the luminous signal corresponding to the faint signal in full times (more than eight times) during given time. In the other wards, the integration times of the powerful sample signal is made less than that of the faint signal.

Further, for example, in the case that image signal is integrated in ten minutes a value being divided is used for display of the morphological image, which is obtained through the integration value of the powerful image signal being divided by the integration time or a proportion to the integration times.

Accordingly, the saturation of the sample morphological signal can be avoided. Further the faint signal can be emphasized.

As described in the foregoing, the present invention can be applied to a system in which signals corresponding to the continuous area and the discrete area are integrated and then added up, and also to a system in which the signals are added up first and then multiplied.

Although several embodiments have been described, the present invention includes the following.

In the case of the EELS (X-ray analysis), the first detection signal is an STEM image (scan transmission image) and the second detection signal is an electron ray of energy loss.

The sample 5 is a cell, an inorganic material, or the like. The continuous area image refers to the shape of the cell, the contour image of the boundary surface, the micro-discrete area image refers to the distribution of elements such as calcium, sodium and the like, and also to the distribution of component elements such as silicon and the like.

What is claimed is:

1. An apparatus for displaying a sample image comprising:
    a scanning illumination system for scanning a sample by an irradiation ray being relatively moved;
    a first detection portion for detecting a first detection signal obtained from a continuous area of said sample by the irradiation ray;
    a second detection portion for detecting a faint second detection signal obtained from a micro-discrete area of said sample by the irradiation ray;
    a signal processing portion for processing the second detection signal such that a pixel size in accordance with said second detection signal is enlarged relative to a pixel size in accordance with said first detection signal;

an image signal formation portion for forming a superimposed image signal by superimposing the second detection signal processed by said signal processing portion upon said first detection signal; and an image display portion for displaying an image of said sample in accordance with said superimposed image signal.

2. An apparatus for displaying a sample image according to claim 1, in which said first detection signal is a black and white same morphological signal in accordance with any of a secondary electron, a reflection electron, a transmission electron, a tunnel electron, and a scanning transmission image obtained from the sample, and said second detection signal is a faint sample component signal based on any of a cathode-luminescence, X-ray, Auger-electron, non elastic scattering obtained from the sample.

3. An apparatus for displaying a sample image according to claim 1, in which said signal processing portion multiplies said second detection signal for a predetermined time interval, and said image signal formation portion forms a superimposed image signal by superimposing the multiplied second detection signal upon the first detection signal.

4. An apparatus for displaying a sample image according to claim 1, in which said image signal formation portion forms a final superimposed image signal to be displayed on an image display portion by multiplying the superimposed image signal obtained by superimposing the second detections signal processed by said signal processing portion upon the first detection signal, for a predetermined time interval.

5. A sample image display device according to claim 2, wherein said signal processing portion makes the integration times of the powerful sample image signal less than that of the faint color sample component signal in given time.

6. A sample image display device according to claim 2, wherein said signal processing portion provides a value being divided used for display of the sample image signal in given time, which is obtained through the integration value of the powerful sample image signal being divided by integration times.

* * * * *

UNITED STATES PATENT AND TRADEMARK OFFICE
CERTIFICATE OF CORRECTION

PATENT NO. : 5,393,976
DATED : February 28, 1995
INVENTOR(S) : Hirotami KOIKE

It is certified that error appears in the above-indentified patent and that said Letters Patent is hereby corrected as shown below:

Claim 4, Column 10, Line 10, "detections" should read --detection--.

On the title page, item [57]:

Abstract, Lines 3, 6, and 9, delete second occurrences of "ray".

Signed and Sealed this

Twentieth Day of June, 1995

BRUCE LEHMAN

Attest:

Attesting Officer

Commissioner of Patents and Trademarks